(12) United States Patent
Brown et al.

(10) Patent No.: US 7,691,665 B2
(45) Date of Patent: Apr. 6, 2010

(54) PROCESS FOR MAKING AN ORGANIC FIELD EFFECT TRANSISTOR

(75) Inventors: Beverley Anne Brown, Warrington (GB); Janos Veres, Manchester (GB); Simon Dominic Ogier, Sowerby Bridge (GB)

(73) Assignee: Merck Patent GmbH, Darmstadt (DE)

( * ) Notice: Subject to any disclaimer, the term of this patent is extended or adjusted under 35 U.S.C. 154(b) by 13 days.

(21) Appl. No.: 11/666,751

(22) PCT Filed: Oct. 4, 2005

(86) PCT No.: PCT/EP2005/010661

§ 371 (c)(1),
(2), (4) Date: May 2, 2007

(87) PCT Pub. No.: WO2006/048092

PCT Pub. Date: May 11, 2006

(65) Prior Publication Data

US 2007/0259477 A1    Nov. 8, 2007

(30) Foreign Application Priority Data

Nov. 3, 2004    (GB) .................................. 0424342.4

(51) Int. Cl.
*H01L 51/40* (2006.01)

(52) U.S. Cl. .................... 438/99; 257/40; 257/642; 257/E51.001

(58) Field of Classification Search ................... 438/99; 257/40, E51.001–E51.007, 642
See application file for complete search history.

(56) References Cited

U.S. PATENT DOCUMENTS

| 4,801,512 | A | 1/1989 | Macdiarmid et al. |
| 2002/0155729 | A1* | 10/2002 | Baldwin et al. ............. 438/780 |
| 2004/0124416 | A1* | 7/2004 | Knipp et al. .................. 257/72 |
| 2004/0129978 | A1* | 7/2004 | Hirai .......................... 257/347 |
| 2004/0161873 | A1* | 8/2004 | Dimitrakopoulos et al. ... 438/99 |

OTHER PUBLICATIONS

Hart et al., "Low-Cost All-Polymer Integrated Circuits", 1998, ESSCIRC' 98, pp. 30-34.*

* cited by examiner

*Primary Examiner*—Alexander G. Ghyka
*Assistant Examiner*—Leonard Chang
(74) *Attorney, Agent, or Firm*—Millen, White, Zelano & Branigan, P.C.

(57) ABSTRACT

The present invention relates to a process for reducing the mobility of an semiconductor (OSC) layer in an electronic device, which has a semiconducting channel area, in specific areas outside said channel area by applying an oxidzing agent to the OSC layer.

19 Claims, 4 Drawing Sheets

PROCESS FOR MAKING AN ORGANIC FIELD EFFECT TRANSISTOR

The present invention relates to a process for preparing improved electronic devices, in particular organic field effect transistors (OFETs).

Organic field effect transistors (OFETs) are used in display devices and logic capable circuits. For many display applications a high on/off ratio is required so that sufficient contrast and a reliable dynamic operation is obtained. Improvements in the on/off ratio have been achieved in the past by patterning of the organic semiconductor (OSC) layer to reduce parasitic leakage currents (U.S. Pat. No. 5,854,139). The semiconductor layer may be patterned by conventional lithography using an etching step to remove the layer from unwanted areas. Such techniques are well established in inorganic electronics. However, organic semiconductors (OSC) are often not easily processed by etching. For example the OSC layer may be deposited by inkjet on active areas only. U.S. Pat. No. 5,854,139 discusses patterning an oligothiophene OSC by illuminating the OSC layer through an optical mask. The on/off ratio may also be reduced by improving the circuit design. U.S. Pat. No. 6,433,357 proposes a method to reduce the off current by using a guard electrode to control the charge density in the OSC layer between pixel elements. Unfortunately this technique may not be convenient for the type of circuit to be patterned, and may reduce the aperture ratio of a display.

It is desirable to be able to reduce the charge mobility 'μ' of an organic semiconducting layer in certain areas whilst maintaining the integrity of the same and maintaining the charge mobility in the channel area.

It is therefore an aim of the present invention to improve the on/off ratio in an OFET and maintain the mobility of the layer in the channel area whilst reducing the mobility in other areas. Another aim of the present invention is to provide an improved process for reducing the mobility in selected areas of an OSC layer which does not have the drawbacks of prior art methods and allows time-, cost- and material-effective production of electronic devices at large scale. Other aims of the present invention are immediately evident to the expert from the following detailed description.

It was found that these aims can be achieved by providing materials and methods as claimed in the present invention.

The present invention relates to a process of reducing the mobility of an organic semiconductor (OSC) layer in an electronic device, which has a semiconducting channel area, in specific areas outside said channel area by applying an oxidizing agent, which is preferably a flux of plasma discharge or an acid, to the OSC layer.

The invention further relates to an electronic device obtained by a process as described above and below.

The advantage of the process according to the present invention is that the OSC is effectively patterned without removing it from inactive areas. The OSC may be deposited area-wise which improves uniformity and productivity. Structural elements of the device/circuit that are already present, such as the gate electrode, can be used to affect the patterning of the semiconductor in a single step. This offers self alignment as high mobility areas are required only under the gate electrodes. Thin film transistor (TFT) circuits often include a "black mask" underneath active TFT areas to protect the device from light. Such a mask may also be conveniently used in the patterning process according to the present invention as the layer is already present in the device. The invention can be used in both top and bottom device architectures with variations of the position of the masking electrode/area. Additional photomasks or patterning techniques are not necessarily required. Also, the preparation of a patterned OSC layer e.g. by ink-jet printing is not necessarily required. However, if desired, an alternative masking technique may be used such as shadow masking, photoresist or a printed mask layer, or a protective patterned layer is applied e.g. by printing techniques to cover the OSC layer.

The process of the present invention involves creating a field-effect transistor for example as shown in FIG. 1 and reducing the mobility of the OSC layer in areas outside the conducting channel area of the device by applying an oxidizing agent, for example using plasma processing. It has now been found that an additional layer (such as the gate metal (4) in FIG. 1) can be used as a resist material to protect the OSC layer within the channel area against the reactive species generated in the plasma. Whilst not wishing to be bound by any particular theory it is likely that the plasma processing operation damages the OSC in areas not protected by the metal, thus reducing the mobility of the OSC in this area. Consequently, the OFET treated by this method exhibits a lower off current when compared to a device that has not been treated. The inventors surprisingly discovered that the plasma process can be used to reduce the mobility through the gate insulator. This is particularly advantageous as protective layers are difficult to pattern directly on top of the OSC, whereas defining a protective pattern above an insulating layer is less demanding.

The inventors also found that reactive species of the plasma are effective in rendering the OSC inactive in a short exposure. It was also found that the reduction of OSC mobility is not due to the UV light generated in the plasma, and UV light would be less effective in reducing the OSC mobility.

The plasma process described herein has the additional advantage of using a layer that already exists within the OFET structure to pattern the OSC layer. This saves time and also does not expose the OSC to processing steps that may damage the layer, such as solvents used in coating photoresist materials, stripping, or cleaning steps. It also has the advantage, e.g. compared to ink-jet printing of a patterned OSC layer, in that the OSC material can be formulated in a wide variety of solvents and can be coated uniformly over large areas by many commonly used processes (for example spin coating, doctor-blading, curtain coating, etc.). It should be noted that the technology of the off current in OFETs is an important parameter. In a display backplane the transistor has to drive current into a pixel as fast as possible during its on state, hence the requirement for high mobility. In addition, however, the transistor then has to prevent this charge from leaking away during the off cycle which lasts much longer that the on cycle. A transistor with a low off current will prevent this charge from leaking away.

In another preferred embodiment of the invention, the mobility of the OSC layer is reduced by applying an acid to the OSC layer. This can be achieved for example by dipping the OSC layer, or an electronic device comprising the OSC layer and a dielectric layer covering said OSC layer, in an acid bath. Alternatively an acid, or a formulation comprising the acid, is sprayed onto the OSC layer or the dielectric layer covering the OSC layer. The acid permeates the dielectric and the OSC layer in the unprotected areas. Surprisingly this leads to a reduction of the conductivity in the unprotected areas, thus increasing the selectivity of the inventive process. As a result a transistor device thus treated shows a higher On/Off ratio.

A preferred acid or acid composition contains Nitric acid. Hydrochloric, Sulphuric, Acetic and Phosphoric acids on their own are less preferred.

Preferred embodiments of the invention relate to a process wherein
- the areas wherein the charge mobility of the OSC layer is reduced are not removed after the plasma processing step,
- the OSC layer is selectively protected by a protective patterned layer covering the areas wherein the charge mobility shall not be reduced,
- the protective layer is an inorganic layer, e.g. a layer comprising one or more metals or metal oxides,
- the protective layer is an organic layer, e.g. a layer comprising a polymer, a photoresist or an organic ink,
- the protective layer comprises inorganic particles in an organic resin or ink,
- the protective layer is deposited by printing techniques, e.g. by inkjet or microcontact printing, or by photolithography,
- the protective layer is a functional component of the electronic device, like for example the gate electrode in a transistor device or the black mask in a TFT array,
- the OSC layer comprises a polyacene, preferably a formulation comprising a polyacene and an organic binder.

The invention also relates to an electronic device obtained by a process according to the present invention. Such a device is for example an organic field effect transistor (OFET), thin film transistor (TFT), component of integrated circuitry (IC), radio frequency identification (RFID) tag, organic light emitting diode (OLED), electroluminescent display, flat panel display, backlight, photodetector, sensor, logic circuit, memory element, capacitor, photovoltaic (PV) cell, charge injection layer, Schottky diode, antistatic film, conducting substrate or pattern, photoconductor, electrophotographic element.

Especially preferred is an electronic device which
- comprises an OSC layer and a protective layer that are separated by an insulating layer, such as a gate dielectric or an interlayer dielectric, which forms an integral part of the device,
- comprises a gate electrode which serves as protective patterned layer in the inventive process,
- is a TFT array for a display, e.g. a liquid crystal display, which comprises a black mask that serves as protective patterned layer,
- is a top gate or bottom gate OFET device.

The present invention will now be described in relation to FIGS. 1, 2, 3 and 4.

Figure 1:
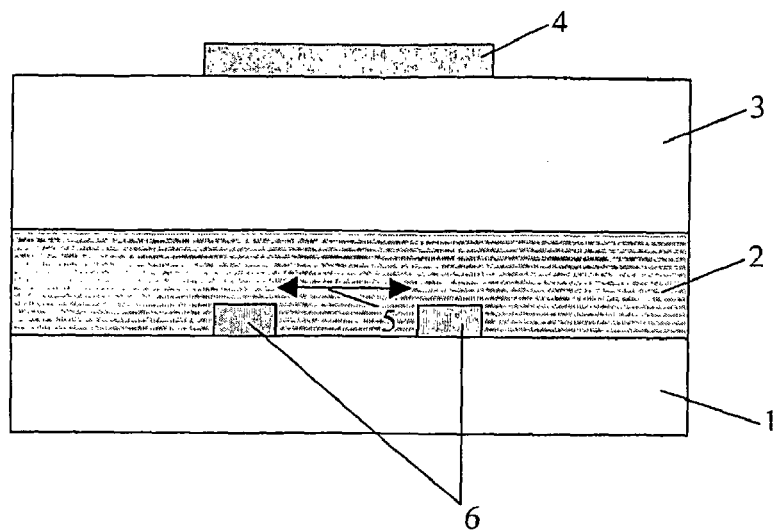
FIG. 1 is a schematic representation of an organic field effect transistor.

In FIG. 1 a top-gate OFET structure is depicted wherein source and drain electrodes (6) are patterned on a substrate (1), a layer of OSC material (2) is deposited on the source and drain electrodes. On top of the OSC, a layer of dielectric material (3) is deposited followed by the gate metal (4). The distance (5) between the electrodes (6) is known as the channel area.

In the present invention, suitable metals which can be used for the gate or other masking layer (4) include but are not limited to for example gold, aluminium, aluminium/neodymium, aluminium oxide, silicon nitride and silicon dioxide.

The present invention can also be applied to OFET devices prepared with a range of organic semiconducting materials, including but not limited to, for example, compounds comprising a field effect mobility μ of more than $10^{-5}$ $cm^2V^{-1}S^{-1}$, more preferably $10^{-2}cm^2V^{-1}S^{-1}$, for example soluble and insoluble polyacene compounds, in particular pentacene compounds, as described in WO 2005/055248 A2.

The OSC layer preferably comprises a semiconducting compound selected from soluble polyacenes, preferably pentacenes as disclosed in WO 2005/055248 A2, the entire disclosure of which is incorporated into this application by reference. These polyacenes are selected of the following formula

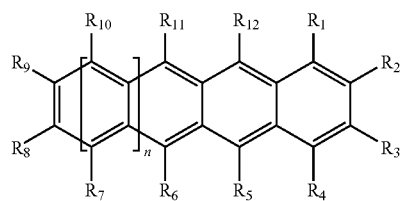

wherein each of $R_1$, $R_2$, $R_3$, $R_4$, $R_5$, $R_6$, $R_7$, $R_8$, $R_9$, $R_{10}$, $R_{11}$ and $R_{12}$, which may be the same or different, independently represents hydrogen; an optionally substituted $C_1$-$C_{40}$ carbyl or hydrocarbyl group; an optionally substituted $C_1$-$C_{40}$ alkoxy group; an optionally substituted $C_6$-$C_{40}$ aryloxy group; an optionally substituted $C_7$-$C_{40}$ alkylaryloxy group; an optionally substituted $C_2$-$C_{40}$ alkoxycarbonyl group; an optionally substituted $C7$-$C_{40}$ aryloxycarbonyl group; a cyano group (—CN); a carbamoyl group (—C(=O)NH$_2$); a haloformyl group (—C(=O)—X, wherein X represents a halogen atom); a formyl group (—C(=O)—H); an isocyano group; an isocyanate group; a thiocyanate group or a thioisocyanate group; an optionally substituted amino group; a hydroxy group; a nitro group; a $CF_3$ group; a halo group (Cl, Br, F); or an optionally substituted silyl group; and wherein independently each pair of $R_2$ and $R_3$ and/or $R_8$ and $R_9$, may be cross-bridged to form a $C_4$-$C_{40}$ saturated or unsaturated ring, which saturated or unsaturated ring may be intervened by an oxygen atom, a sulphur atom or a group shown by formula —N(R$_a$)— (wherein R$_a$ is a hydrogen atom or an optionally substituted hydrocarbon group), or may optionally be substituted; and wherein one or more of the carbon atoms of the polyacene skeleton may optionally be substituted by a heteroatom selected from N, P, As, O, S, Se and Te; and wherein independently any two or more of the substituents $R_1$-$R_{12}$ which are located on adjacent ring positions of the polyacene may, together, optionally constitute a further $C_4$-$C_{40}$ saturated or unsaturated ring optionally interrupted by O, S or —N(R$_a$) where R$_a$ is as defined above) or an aromatic ring system, fused to the polyacene; and wherein n is 0, 1, 2, 3 or 4 preferably n is 0, 1 or 2, most preferably n is 0 or 2 that is the polyacene compound is a pentacene compound (n=2) or a 'pseudo pentacene' (n=0) compound.

In another preferred embodiment of the present invention the OSC layer comprises a formulation comprising a polyacene as disclosed above and an organic binder, in particular an organic binder which has a low permittivity, ∈, at 1,000 Hz of 3.3 or less.

The binder is selected for example from poly(α-methylstyrene), polyvinylcinnamate, poly(4-vinylbiphenyl) or poly (4-methylstyrene, or blends thereof. The binder may also be a semiconducting binder selected for example from polyarylamines, polyfluorenes, polythiophenes, polyspirobifluorenes, substituted polyvinylenephenylenes, polycarbazoles or polystilbenes, or copolymers thereof. A preferred dielectric material (3) for use in the present invention preferably comprises a material with a low permittivity of between 1.5 and 3.3 at 1000 Hz, such as for example Cytop™809 m available from Asahi Glass.

In the plasma process according to the present invention, suitable gases which may be utilized include for example oxygen, ozone, nitrogen, carbon tetrafluoride, trifluormethane ($CHF_3$), sulphur hexafluoride $SF_6$ and mixtures thereof.

Other types of fluxes (e.g. reactive gases) may be used to bring about the change in mobility of the OSC. Similarly, other types of masking materials may be used to protect the OSC in the desired areas, so the invention is not limited to microwave generated oxygen plasma. Generally, the use of UV light is less preferred because the light is less effective in reducing the activity of the OSC. In addition the light often causes undesirable doping. Both of these factors are illustrated by way of example. The preferred exposure to reduce the mobility is plasma.

The duration and the intensity of the plasma can be varied to optimise the inventive process, depending on the plasma reactor.

The invention will now be described in more detail by reference to the following examples, which are illustrative only and do not limit the scope of the invention.

The following parameters are used:

is the charge carrier mobility

W is the length of the drain and source electrode

L is the distance of the drain and source electrode $I_{DS}$ is the source-drain current $C_i$ is the capacitance per unit area of the gate dielectric $V_G$ is the gate voltage (in V)

$V_{DS}$ is the source-drain voltage $V_0$ is the offset voltage

Unless stated otherwise, all specific values of physical parameters like the permittivity ($\in$), charge carrier mobility ($\mu$), solubility parameter ($\delta$) and viscosity ($\eta$) as given above and below refer to a temperature of 20° C. (+/−1° C.).

EXAMPLE 1

A test field effect transistor was manufactured using a glass substrate, upon which were patterned Pt/Pd source and drain electrodes by shadow masking. A semiconductor formulation was prepared using a compound of Formula (1) blended with an inert binder poly(alphamethylstyrene) p-αMS (Poly(alpha-methylstyrene) Aldrich Cat no. 19,184-1) in a ratio of 1:1 by weight. The semiconductor formulation was dissolved 4 parts into 96 parts of solvent (p-xylene), and spin coated onto the substrate and Pt/Pd electrodes at 500 rpm for 18 s. To ensure complete drying the sample was placed in an oven for 20 minutes at 100° C. A solution of the insulator material (Cytop 809M, Asahi glass) was mixed 1:1 by weight with the fluorosolvent FC43 (Acros cat. no.12377) and then spin-coated onto the semiconductor layer, giving a thickness of approximately 1 µm. The sample was placed once more in an oven at 100° C. to evaporate solvent from the insulator layer. A gate contact was defined over the device channel area by evaporation of 50 nm of gold through a shadow mask. To determine the capacitance of the insulator layer a number of devices were prepared which consisted of a non-patterned Pt/Pd base layer, an insulator layer prepared in the same way as that on the FET device, and a top electrode of known geometry. The capacitance was measured using a hand-held multimeter, connected to the metal either side of the insulator. Other defining parameters of the transistor are the length of the drain and source electrodes facing each other (W=30 mm) and their distance from each other (L=130 µm).

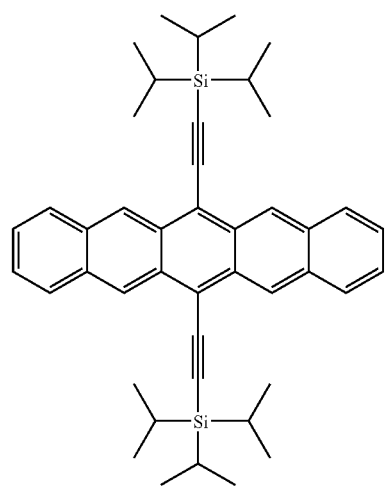

Formula (1)

The voltages applied to the transistor are relative to the potential of the source electrode. In the case of a p-type gate material, when a negative potential is applied to the gate, positive charge carriers (holes) are accumulated in the semiconductor on the other side of the gate dielectric. (For an n channel FET, positive voltages are applied). This is called the accumulation mode. The capacitance/area of the gate dielectric $C_i$, determines the amount of the charge thus induced. When a negative potential $V_{DS}$ is applied to the drain, the accumulated carriers yield a source-drain current $I_{DS}$ which depends primarily on the density of accumulated carriers and, importantly, their mobility in the source-drain channel. Geometric factors such as the drain and source electrode configuration, size and distance also affect the current. Typically a range of gate and drain voltages are scanned during the study of the device. The source-drain current is described by Equation 1

$$I_{DS} = \frac{\mu W C_i}{L}\left((V_G - V_0)V_{DS} - \frac{V_{DS}^2}{2}\right) + I_\Omega. \qquad \text{Equation (1)}$$

wherein $V_0$ is an offset voltage and $I_\Omega$ is an ohmic current independent of the gate voltage and is due to the finite conductivity of the material. The other parameters have been described above.

For the electrical measurements the transistor sample was mounted in a sample holder. Microprobe connections were made to the gate, drain and source electrodes using Karl Suss PH100 miniature probe-heads. These were linked to a Hewlett-Packard 4155B parameter analyser. The drain voltage was set to −5 V and the gate voltage was scanned from +10 to −40V in 0.5 V steps. After this the drain was set to −30V and the gate once again scanned between +10V and −40V. In accumulation, when $|V_G|>|V_{DS}|$ the source-drain current varies linearly with $V_G$. Thus the field effect mobility can be calculated from the gradient (S) of $I_{DS}$ vs. $V_G$ given by Equation 2.

$$S = \frac{\mu W C_i V_{DS}}{L} \quad \text{Equation (2)}$$

All field effect mobilities quoted below were calculated from this regime (unless stated otherwise). Where the field effect mobility varied with gate voltage, the value was taken as the highest level reached in the regime where $|V_G|>|V_{DS}|$ in accumulation mode.

The off current of the transistor was defined as the lowest current recorded during the gate sweep from +10V to −40V. This is quoted for both of the drain voltages used. The on/off ratio of the device is defined as the on current at −40V $V_g$ divided by the lowest off current for the $V_d$=−30V scan.

Figure 2:
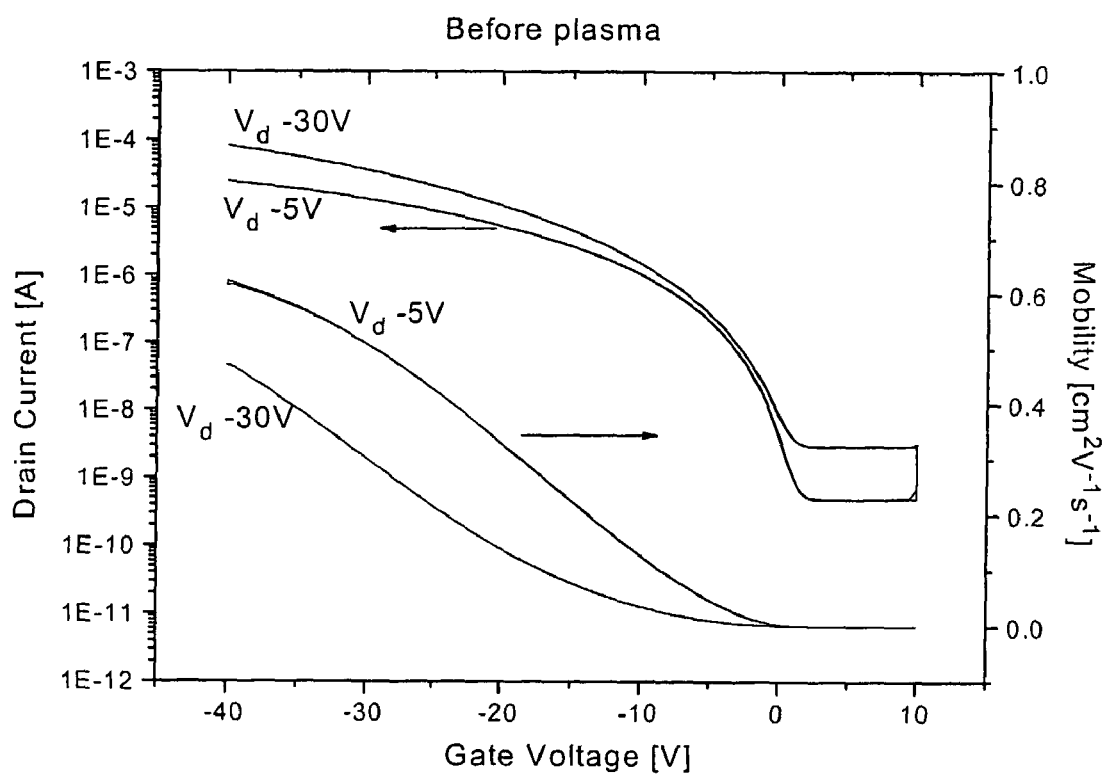
FIG. 2 illustrates the transfer characteristics of an OFET made using the method of example 1.

FIG. 2 illustrates the transistor characteristics of an OFET device fabricated by the method described in Example 1 above.

Figure 3:
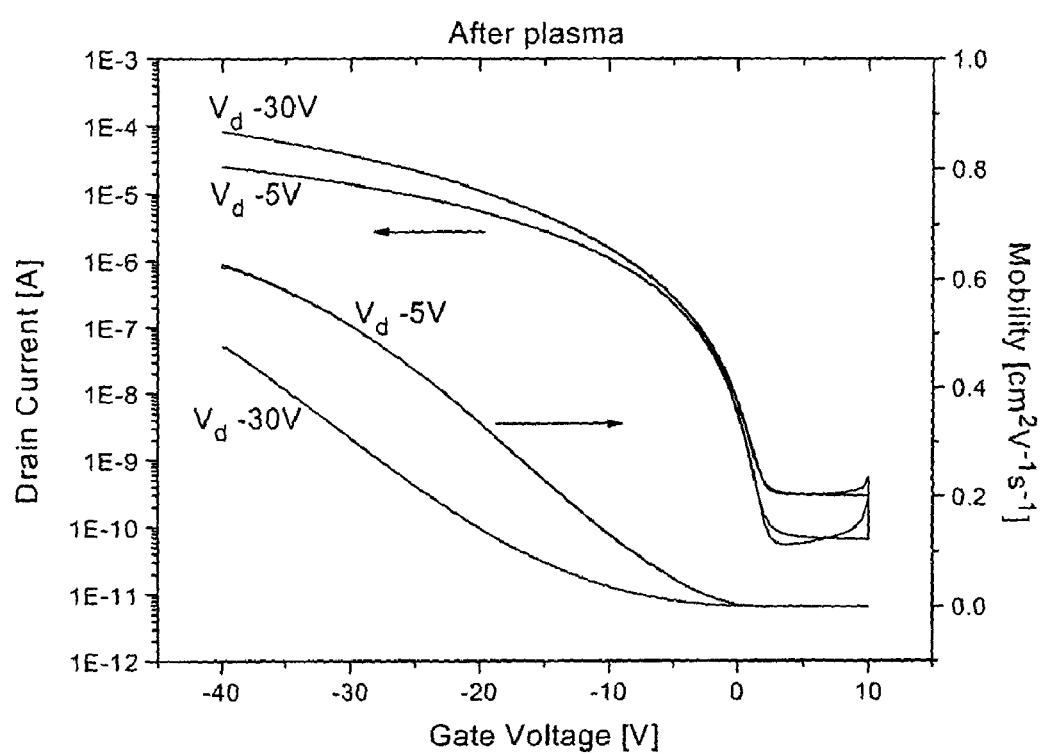
FIG. 3 illustrates the transfer characteristics of the OFET device after plasma processing.

The device prepared according to Example 1 was then inserted into a microwave plasma oven (TePla model 400) and subjected to an oxygen plasma ($O_2$ flow rate 500 mL/min, power=1 kW) for 5 minutes. Following plasma processing, the device was re-measured and the transfer characteristics are illustrated in FIG. 3.

Table (1) below illustrates the parameters extracted from FIGS. 2 and 3.

TABLE 1

| Parameter | Before plasma process | After plasma process |
|---|---|---|
| Mobility | 0.62 cm$^2$/Vs | 0.62 cm$^2$/Vs |
| Off current at $V_d$ = −5 V | 482 pA | 54.5 pA |
| Off current at $V_d$ = −30 V | 2.88 nA | 300 pA |
| On/Off ratio for $V_d$ = −30 V | 2.82 × 10$^4$ | 2.85 × 10$^5$ |

These results clearly show that treating an OFET device treated with a plasma processing step according to the present invention increases the on/off ratio by an order of magnitude without altering the mobility of the device.

EXAMPLE 2

Figure 4A:
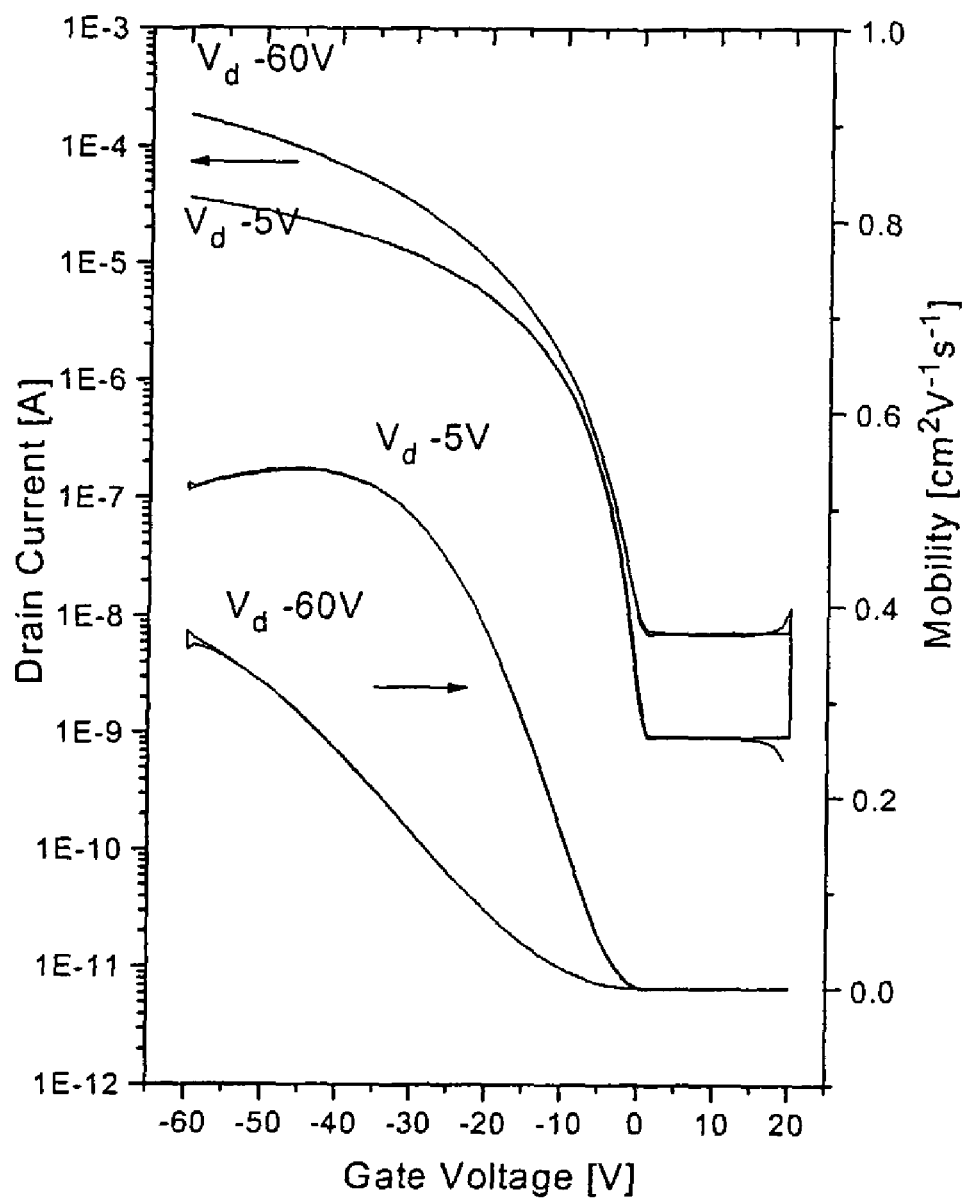
FIG. 4A and 4B illustrate the effect of an acid bath on the transfer characteristics of an OFET made using the method of example 2.
Figure 4B:
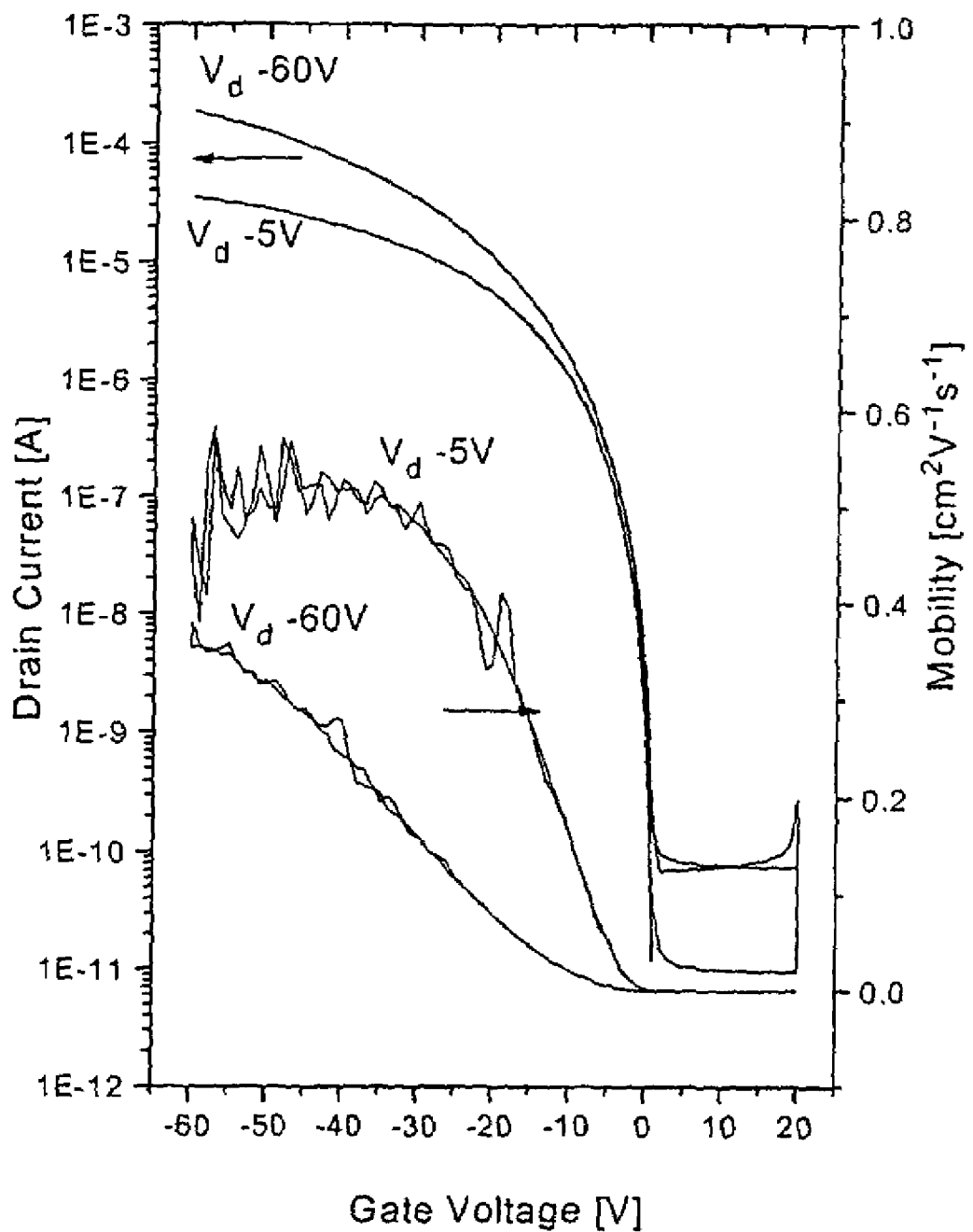

An OFET was made using the method described in Example 1. The device was characterized and then immersed in a standard Aluminium etch ($H_3PO_4$ 60%, $CH_3COOH$ 10%, $HNO_3$ 10%, Water 20%) for 3 minutes and then rinsed in water and dried. The device was measured once more. FIGS. 4A and 4B show the performance of the device before (A) and after (B) the acid treatment, indicating an increase in on/off ratio of 2 orders of magnitude whilst the mobility remains unaffected.

EXAMPLE 3

Comparative Example

An OFET was made using the method described in Example 1 except that the OSC formulation contained the semiconductor of Formula 1 and polystyrene (Mw 1,000,000) mixed 50:50 at 2% total solids in tetralin. The OSC formulation was spun at 500 rpm for 10 s followed by spinning at 2000 rpm for 60 s. In this case the substrate was glass and the source and drain electrodes were Au. The electrodes were treated with a 10 mM solution of pentafluorobenzenethiol (Aldrich cat. No. P565-4) for 10 minutes (immersion).

The device was exposed to UV light (intensity 70 mW/cm$^2$) for a period of 1 minute and then a period of 15 minutes. The mobility and on/off ratio was measured after these treatments.

The mobility and on/off ratio of the device is shown in Table (2) below for the two exposures. As can be seen, there is a large decrease in the on/off ratio of the device. This indicates that light causes doping of the OSC material in areas not covered by the gate rather than reducing the mobility. Hence patterning by light is not desirable in this invention.

TABLE 2

| After Fabrication | | After Exposure for 1 min | | After Exposure for 15 mins | |
|---|---|---|---|---|---|
| On/Off ratio | µ [cm$^2$/Vs] | On/Off ratio | µ [cm$^2$/Vs] | On/Off ratio | µ [cm$^2$/Vs] |
| 244051 | 1.106 | 39994 | 1.100 | 4860 | 0.928 |

EXAMPLE 4

Comparative Example

An OFET was made using the method described in Example 1 except that the gate metal was omitted prior to plasma treatment. The device with no gate was exposed to plasma (1 KW 500 mL/min for 5 minutes). The gate metal was then evaporated on the devices. Upon testing these devices showed a mobility of 1.2×10$^{-2}$ cm$^2$/Vs. This demonstrates that, without the gate metal, the OSC material is damaged by the plasma and the mobility reduced by a factor of ~40.

The invention claimed is:

1. A process for preparing an organic electronic (OE) device comprising an organic semiconductor (OSC) layer which has a semiconducting channel area and a semiconducting area outside said semiconducting channel area, comprising the step of reducing the mobility of an organic semiconductor the (OSC) layer only in specific semiconducting areas outside said semiconducting channel area, by applying an oxidizing agent to the OSC layer in only said specific semiconducting areas of the OSC layer outside said semiconducting channel area.

2. A process according to claim 1, wherein the oxidizing agent is a flux of plasma discharge.

3. A process according to claim 1, wherein the oxidizing agent is an acid.

4. A process according to claim 1, wherein the OSC layer is selectively protected by a protective patterned layer covering the areas wherein the mobility shall not be reduced.

5. A process according to claim 4, wherein the OSC layer and the protective patterned layer are separated by an insulating layer.

6. A process according to claim 5, wherein the insulating layer is a gate dielectric or an interlayer dielectric.

7. A process according to claim 4, wherein the protective layer is an inorganic layer.

8. A process according to claim 7, wherein the protective layer comprises a metal or metal oxide.

9. A process according to claim 4, wherein the protective layer is an organic layer.

10. A process according to claim 9, wherein the protective layer comprises a polymer, a photoresist or an organic ink.

11. A process according to claim 4, wherein the protective layer comprises inorganic particles in an organic resin or ink.

12. A process according to claim 4, wherein the protective layer is deposited by a printing technique.

13. A process according to claim 12, wherein the protective layer is deposited by inkjet or microcontact printing.

14. A process according to claim 4, wherein the protective layer is a functional component of the organic electronic device.

15. A process according to claim 1, wherein the OSC layer comprises a polyacene and optionally an organic binder.

16. A process according to claim 1, wherein the organic electronic device is an organic field effect transistor (OFET), thin film transistor (TFT), component of integrated circuitry (IC), radio frequency identification (RFTD) tag, organic light emitting diode (OLED), electroluminescent display, flat panel display, backlight, photodetector, sensor, logic circuit, memory element, capacitor, photovoltaic (PV) cell, charge injection layer, Schottky diode, planarising layer, antistatic film, conducting substrate or pattern, photoconductor, or electrophotographic element.

17. A process according to claim 1, wherein the organic electronic device comprises a gate electrode that serves as a protective patterned layer.

18. A process according to claim 1, wherein the organic electronic device is a TFT array for a display comprising a black mask that serves as a protective patterned layer.

19. A process according to claim 1, wherein the organic electronic device is a top gate or bottom gate OFET device.

* * * * *

UNITED STATES PATENT AND TRADEMARK OFFICE
CERTIFICATE OF CORRECTION

| | | |
|---|---|---|
| PATENT NO. | : 7,691,665 B2 | Page 1 of 1 |
| APPLICATION NO. | : 11/666751 | |
| DATED | : April 6, 2010 | |
| INVENTOR(S) | : Brown et al. | |

It is certified that error appears in the above-identified patent and that said Letters Patent is hereby corrected as shown below:

Column 8, line 44 reads "ing the step of reducing the mobility of an organic semicon" should read
-- ing the step of reducing the mobility of --

Column 8, line 45 reads "ductor the (OSC) layer only in specific semiconducting areas" should read
-- the (OSC) layer only in specific semiconducting areas --

Signed and Sealed this
Third Day of May, 2011

David J. Kappos
*Director of the United States Patent and Trademark Office*